(12) United States Patent
Xu et al.

(10) Patent No.: US 6,778,113 B2
(45) Date of Patent: Aug. 17, 2004

(54) CANCELING FEEDBACK RESISTER LOADING EFFECT IN A SHUNT-SHUNT FEEDBACK CIRCUIT

(75) Inventors: Gonggui Xu, Plano, TX (US); Haydar Bilhan, Dallas, TX (US); Huimin Xia, Richardson, TX (US); Feng Ying, Plano, TX (US); Xiaopeng Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 10/160,724

(22) Filed: Jun. 3, 2002

(65) Prior Publication Data

US 2003/0223254 A1 Dec. 4, 2003

(51) Int. Cl.[7] .................................................. H03M 1/66
(52) U.S. Cl. ....................................... 341/144; 341/135
(58) Field of Search ................................ 341/144, 118, 341/135; 330/288

(56) References Cited

U.S. PATENT DOCUMENTS

| | | | | |
|---|---|---|---|---|
| 4,488,144 A | * | 12/1984 | Wollman | 341/118 |
| 4,642,551 A | * | 2/1987 | Miller | 323/314 |
| 6,211,661 B1 | * | 4/2001 | Eckhardt | 323/316 |
| 6,353,366 B1 | * | 3/2002 | Chan et al. | 330/305 |
| 6,486,918 B1 | * | 11/2002 | Min | 348/425.1 |
| 6,566,955 B1 | * | 5/2003 | Tang | 330/288 |

* cited by examiner

*Primary Examiner*—Peguy JeanPierre
(74) *Attorney, Agent, or Firm*—W. Daniel Swayze, Jr.; W. James Brady; Frederick J. Telecky, Jr.

(57) ABSTRACT

A shunt-shunt feedback current to voltage converter (60) including a compensating current (22) provided to the output of the amplifier (12) which mirrors the input current (14) advantageously removing the loading effects of the feedback resistor ($R_f$) to the amplifier (12). A current steering DAC (40) is utilized in conjunction with a plurality of polarity control switches (62) to provide either a source current or a sink current to the amplifier input, and a complementary sink current or source current, respectively, to the output of the amplifier such that the amplifier (12) does not provide any current to the feedback resistor. Thus, DC gain of the amplifier is maintained. The current steering DAC (40) provides a matched source current and sink current to achieve this architecture.

20 Claims, 1 Drawing Sheet

CANCELING FEEDBACK RESISTER LOADING EFFECT IN A SHUNT-SHUNT FEEDBACK CIRCUIT

FIELD OF THE INVENTION

The present invention is generally related to current to voltage converters, and more specifically to shunt-shunt feedback current to voltage converters.

BACKGROUND OF THE INVENTION

Current to voltage converters are utilized in a number of applications including electronic devices. One particular type of current to voltage converter is a shunt-shunt feedback current to voltage converter, such as depicted at 10 in FIG. 1. Converter 10 is a typical shunt-shunt feedback current to voltage converter including an operational amplifier 12 having an inverting input, a non-inverting input, and an output $v_{out}$. Converter 10 is also seen to be coupled to a load $Z_L$, and having a feedback loop comprising of a feedback resistor $R_f$. As depicted, an input current 14 is coupled to the inverting input of the amplifier 12 and has a value $i_{in}$.

A typical amplifier 12 has a voltage gain represented as $a_v$, an input impedance $Z_i$, and an output impedance $Z_o$. The feedback loop gain can be represented by:

$$T = \frac{R_f Z_L}{R_f Z_L + Z_o R_f + Z_o Z_L} a_v \frac{Z_i}{Z_i + R_f}$$

As can be appreciated, when input impedance $Z_i$ and the load $Z_L$ are capacitive, then the loop gain at DC can be reduced to the equation:

$$T_{DC} = \frac{R_f}{R_f + Z_o} a_v$$

Thus, when the value of feedback resistor $R_f$ is small compared to the output impendence $Z_o$, the feedback resistor $R_f$'s loading effect decreases loop gain. To maintain the loop gain, the amplifier can have an output stage to achieve a small output impendence $Z_o$. However, the inclusion of such a conventional output stage consumes considerable power.

There is desired an improved shunt-shunt feedback current to voltage converter that reduces or eliminates the loading of the amplifier by the feedback loop resistor $R_f$.

SUMMARY OF THE INVENTION

The present invention achieves technical advantages as a shunt-shunt feedback current to voltage converter including a compensating current provided at the output of the amplifier that mirrors the current at the input of the amplifier such that the amplifier does not provide current to the feedback loop, and hence, the amplifier will not see the feedback $R_f$ as a load. Advantageously, the current provided at the amplifier output mirrors the current at the input such that the amplifier does not provide any current to the feedback loop.

In one preferred embodiment, a current steering digital-to-analog converter (DAC) is utilized that has complementary outputs, these outputs comprising a current source and a current sink of equal values. When the output of the amplifier is positive with respect to common mode, the DAC provides an output sink current to the amplifier input and steers a DAC output source current to the amplifier output. Conversely, when the output of the amplifier is negative with respect to common mode, the DAC provides an output source current to the amplifier input, and steers an output sink current to the amplifier output. Thus, depending on whether the output of the amplifier is positive or negative, the DAC provides complementary outputs to the amplifier input and output such that the amplifier never provides current to the feedback loop and thus does not see the feedback loop as a load which would otherwise reduce the feedback loop gain.

Preferably, a series of polarity control switches are utilized to responsively interface the currents between the DAC and the amplifier input and output. These switches responsively control the current-flow direction to the amplifier input and output as a function of whether the output is positive or negative with respect to common mode.

DETAILED DESCRIPTION OF THE PREFERRED EMBODIMENT

Figure 1:
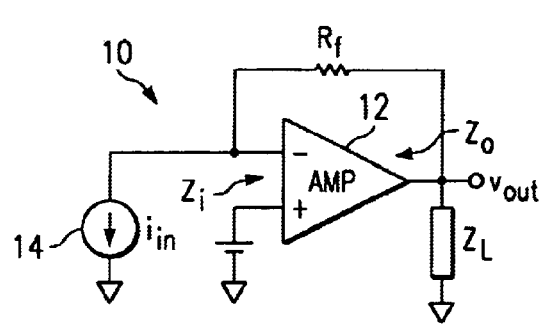
FIG. 1 is a schematic of a conventional shunt-shunt feedback current to voltage converter whereby the feedback resistor $R_f$ tends to load the amplifier and decrease the feedback loop gain.
Figure 2:
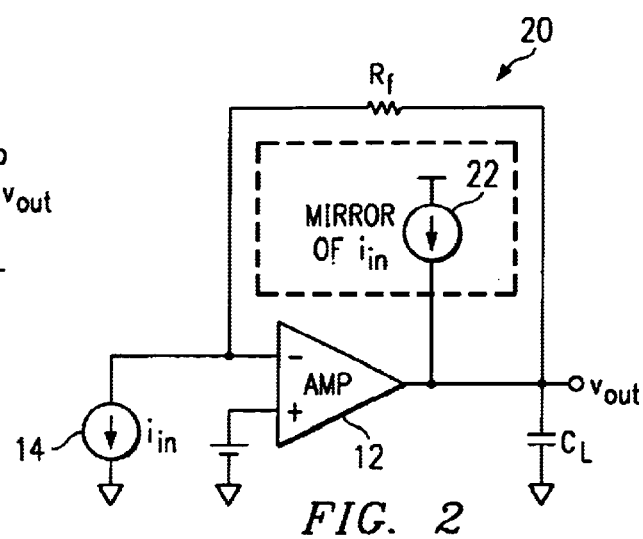
FIG. 2 is a schematic of the present invention including a compensating current provided at the output of the amplifier which mirrors the current at the input of the amplifier such that the amplifier provides no current to the feedback loop and thus the feedback resister $R_f$ is not seen as a load.

Referring now to FIG. 2, there is shown generally at 20 an improved shunt-shunt feedback current to voltage converter according to a preferred embodiment of the present invention. Converter 20 is seen to include an additional compensating current 22 being provided at the output of the amplifier 12 that mirrors the current 14 provided at the input of the amplifier, $i_{in}$.

Advantageously, if the input current 14 is a source current, then the compensating output current 22 is a sink current. Conversely, if the input current 14 is a sink current, such as shown, then the output current 22 is a source current, as shown. Advantageously, by providing the additional compensating current 22 at the output of the amplifier 12 that mirrors the input current 14, the feedback resistor $R_f$ will not be seen as a load to the amplifier 12, and thus, amplifier 12 will not provide any current through the feedback loop, resistor $R_f$. Thus, the feedback loop DC gain become $T_{DC} = a_v$. Therefore, the present invention provides a unique scheme that reduces the loading effect of the feedback loop on the amplifier in a shunt-shunt feedback current to voltage converter without the disadvantage of prior art solutions which consume considerable power.

Figure 3A:
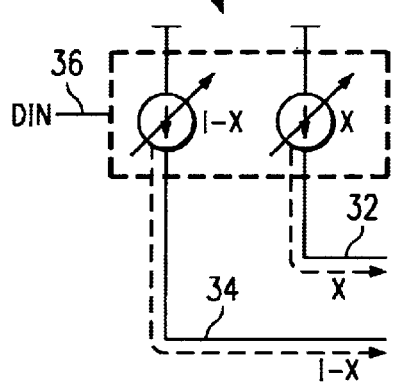
FIG. 3A and FIG. 3B depict a block diagram of a current steering DAC providing a complementary output and an opposite output, respectively.

Referring now to FIG. 3A there is depicted at 30 a current steering digital to analog converter (DAC) having complementary outputs 32 and 34. One current output is represented as X, and the other current output is the compliment I−X. In this embodiment, I is the full-scale current and 0<X<I. The values of the current output at 32 and 34 is controlled by a digital input DIN shown at 36.

In the present invention two opposite and equal DAC current outputs are desired. Thus, an improved current steering DAC is shown at 40 in FIG. 3B which provides two opposite and equal DAC output currents at outputs 42 and 44. In order to implement an opposite current output, a constant sink current I shown at 48 is put in series with a source current 50 having a current I–X. The added constant current sink 48 having current I can be trimmed to match precisely to the full-scale of the DAC 40.

Figure 3B:
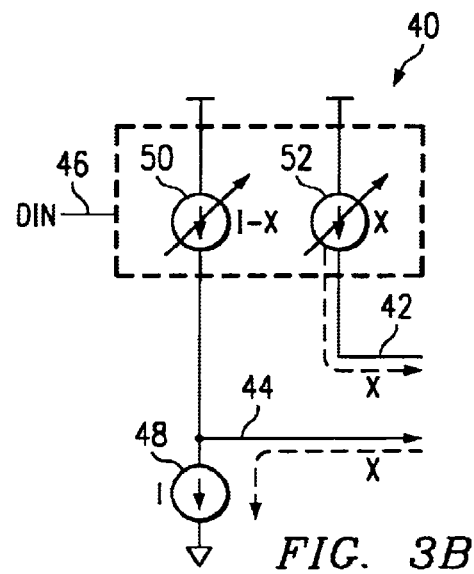
Figure 4:
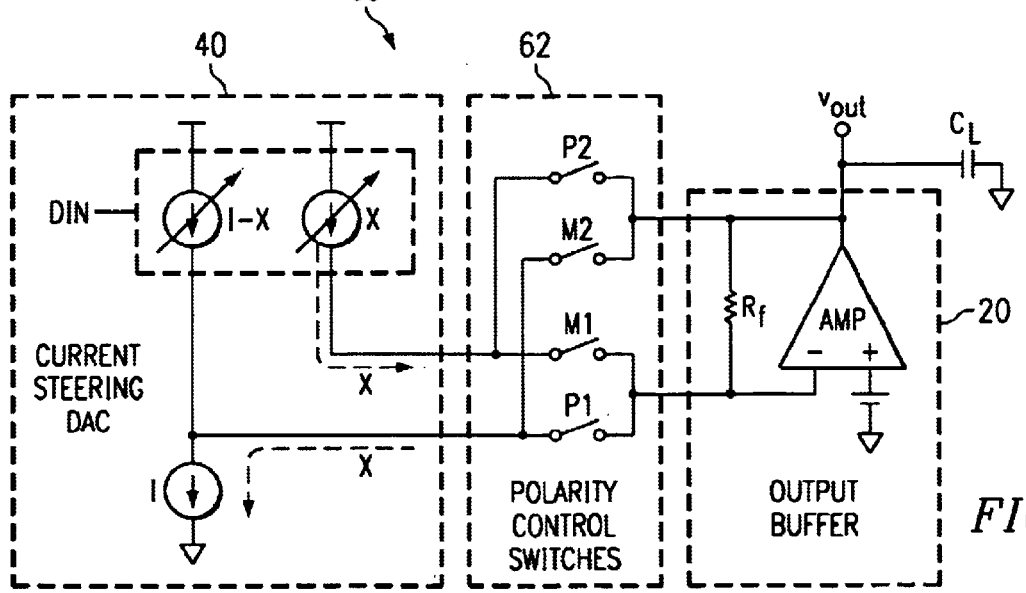
FIG. 4 is an overall DAC architecture including a current steering DAC providing a current and a complementary current of equal magnitude via a plurality of polarity control switches to a shunt-shunt feedback current to voltage converter according to the present invention.

Referring now to FIG. 4, there is shown at 60 an overall DAC architecture according to the present invention including the current steering DAC 40 shown in FIG. 3B interfaced via a plurality of polarity control switches generally shown at 62 to the improved shunt-shunt feedback current to voltage converter 20, as shown. Thus, this DAC architecture 60 has three functional blocks, the current steering DAC 40, the polarity control switches 62, and the output buffer or converter 20. The current steering DAC 40 produces source current X and sink current X from outputs 42 and 44 according to a digital input DIN 46. Advantageously, the source current and sink current are selectively directed by the polarity control switches 62 into the output buffer 20 which is translated thereby into voltage $v_{out}$. Depending on the polarity control switch setup, output $v_{out}$ can swing either positive or negative.

For instance, if the $v_{out}$ swing needs to be positive with respect to common mode, then switches P1 and P2 of switches 62 are closed while switches M1 and M2 are open. Thus, in this configuration switch P1 steers the DAC output sink current X to the amplifier inverting input, while switch P2 steers the DAC output source current X to the amplifier output. Since current through feedback resister $R_f$ is solely provided by the DAC 40, the amplifier 12 itself is not loaded by the feedback resistor $R_f$. Advantageously, the loading of the DAC 40 output current source to the amplifier 12 is much less than any loading of resistor $R_f$.

Conversely, if the output $v_{out}$ swing needs to be negative with respect to common mode, then switch M1 steers the DAC output source current X to the amplifier 12 inverting input, and switch M2 steers the DAC output sink current X to the amplifier output.

Advantageously, the polarity control switches 62 collectively steer the appropriate current to the input and output of the output buffer 12 such that the current provided to the amplifier output mirrors the current provided to the amplifier input such that the feedback resistor $R_f$ is not seen as a load to the amplifier 12, and thus, the feedback loop DC gain is $T_{DC}=a_v$. Advantageously, this architecture utilizes a relatively small mirror current at the output of the amplifier which consumes very little power, thus providing a very efficient shunt-shunt feedback current to voltage converter 60.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A voltage converter circuit, comprising:
   an amplifier having an input and an output;
   a feedback loop coupled between said input and said output to form a shunt-shunt current to voltage converter;
   an input current coupled to said input; and
   a compensating current mirroring said input current and being coupled to said output such that said amplifier does not provide current to said feedback loop.

2. The voltage converter circuit as specified in claim 1 wherein said input current is a sink current and said compensating current is a source current.

3. The voltage converter circuit as specified in claim 1 wherein said input current is a source current and said compensating current is a sink current.

4. The voltage converter circuit as specified in claim 1 wherein said feedback loop comprises a resistor that does not load the amplifier.

5. The voltage converter circuit as specified in claim 1 further comprising a capacitive load coupled to said output.

6. The voltage converter circuit as specified in claim 1 wherein said amplifier has a gain of $a_v$, and said feedback loop also has a gain of $a_v$.

7. The voltage converter circuit as specified in claim 1 wherein said input current and said compensating current are each provided by a current steering digital-to-analog control (DAC) circuit.

8. The voltage converter circuit as specified in claim 7 wherein said DAC provides a first current as said input current and a second current as said compensating current.

9. The voltage converter circuit as specified in claim 8 wherein said first current is a compliment of said second current such that one said current is a source current and said other current is a sink current.

10. The voltage converter circuit as specified in claim 8 wherein said first current is a sink current when said amplifier output is positive, and said second current is a source current.

11. The voltage converter circuit as specified in claim 8 wherein said first current is a source current when said amplifier output is negative, and said second current is a sink current.

12. The voltage converter circuit as specified in claim 7 further comprising a switch coupling said DAC circuit to said amplifier.

13. The voltage converter circuit as specified in claim 12 wherein said switch is dynamically configurable as a function of a polarity of an output signal provided by said amplifier output.

14. The voltage converter circuit as specified in claim 13 wherein said switch is a plurality of switches configured as a polarity control switch.

15. The voltage converter circuit as specified in claim 7 wherein the DAC input current and the compensating current load the amplifier less than a loading of the feedback loop to the amplifier.

16. The voltage converter circuit as specified in claim 7 wherein the values of the input current and the compensating current are adjustably established by a digital input (DIN) control signal.

17. The voltage converter circuit as specified in claim 1 wherein the amplifier is an operational amplifier.

18. A method of operating a shunt-shunt current to voltage converter having an amplifier and feedback loop comprising the steps of:
   providing a compensating current to an output of the converter such that the amplifier does not provide current to the feedback loop.

19. The method as specified in claim 18 wherein the amplifier does not see the feedback loop as a load.

20. The method as specified in claim 18 wherein the compensating current mirrors an input current to the amplifier.

* * * * *